United States Patent [19]

Kurihara

[11] 4,349,789

[45] Sep. 14, 1982

[54] STABILIZED SWEEP FREQUENCY GENERATOR WITH ADJUSTABLE START AND STOP FREQUENCIES

[75] Inventor: Takenori Kurihara, Gyoda, Japan

[73] Assignee: Takeda Riken Kogyo Kabushikikaisha, Tokyo, Japan

[21] Appl. No.: 192,814

[22] Filed: Oct. 1, 1980

[30] Foreign Application Priority Data

Oct. 15, 1979 [JP] Japan .................................. 54-131892

[51] Int. Cl.³ ........................ H03B 23/00; H03L 7/12
[52] U.S. Cl. ............................................ 331/4; 331/14; 331/17; 331/25; 331/178; 307/228; 328/185
[58] Field of Search .................... 331/4, 14, 15, 17, 25, 331/178; 324/77 CS; 307/228; 328/185

[56] References Cited

U.S. PATENT DOCUMENTS

| | | | |
|---|---|---|---|
| 3,504,294 | 3/1970 | Martin, Jr. | 331/178 X |
| 3,681,706 | 8/1972 | Harzer | 331/178 X |
| 4,038,612 | 7/1977 | Borofka et al. | 331/4 X |
| 4,130,808 | 12/1978 | Marzalek | 331/14 |

*Primary Examiner*—Siegfried H. Grimm
*Attorney, Agent, or Firm*—Staas & Halsey

[57] ABSTRACT

The oscillation frequency of a variable frequency oscillator is swept by a sweep signal from a sweep signal generator and the oscillation frequency is compared with a preset sweep start frequency for detecting coincidence therebetween. Upon detecting the coincidence, the sweep operation of the sweep signal generator is stopped and, at the same time, the oscillation frequency of the variable frequency oscillator is made by phase lock loop means to be phase-synchronized with a reference frequency. When the phase synchronization is established, an error signal in the phase synchronization is held and the loop of the phase lock loop means is cut off and then the error signal is applied to the sweep signal generator to re-start the frequency sweep of the variable freqency oscillator. When coincidence is detected between the oscillation frequency of the variable frequency oscillator and a preset sweep stop frequency, the sweep operation is stopped.

27 Claims, 19 Drawing Figures

STABILIZED SWEEP FREQUENCY GENERATOR WITH ADJUSTABLE START AND STOP FREQUENCIES

BACKGROUND OF THE INVENTION

The present invention relates to a sweep signal generating device for use with, for example, a spectrum analyzer, a frequency characteristic monitor or the like, which is adapted to sweep a frequency by providing a corresponding sweep signal.

This kind of sweep signal generating device is used, for example, in the following manner. A frequency-swept signal is supplied to an input of an object to be measured, and an output signal from the object is applied to a vertical deflection circuit of a cathode ray tube display while applying a sweep signal corresponding to the frequency-swept signal to a horizontal deflection circuit of the cathode ray tube display. Thus the frequency characteristic of the output signal is displayed on the screen of the cathode ray tube display. In conventional sweep signal generating devices, the relationship of correspondence between a position on the abscissa on the screen, that is, in the direction of horizontal sweep, and the sweep frequency is not accurately defined. It is general practice to display frequency marks on the screen so as to ensure accurate reading of the frequency of the waveform displayed on the screen. But this involves a relatively complicated arrangement and it is difficult to make a predetermined frequency correspond exactly to a predetermined position on the screen. The U.S. Pat. No. 4,130,808 patented on Dec. 19, 1978 has proposed such a sweep signal generating device. In this prior art, the output from a variable frequency oscillator and the output from a reference signal oscillator are phase-compared with each other and, by the phase-compared output, the oscillation frequency of the variable frequency oscillator is controlled to coincide with a reference frequency thus providing a phase locked loop. After the phase locked loop is established, an error signal in the phase comparison is retained and, at the same time, the phase locked loop is opened and a sweep signal, that is, a ramp voltage is generated. The oscillation frequency of the variable frequency oscillator is varied in a certain direction, that is, upwardly or downwardly of the reference frequency, and when the ramp voltage reaches a predetermined value, the sweep is stopped.

According to this sweep signal generating device, the sweep start point coincides with the reference frequency signal with high accuracy; accordingly, in the case of providing a display, for example, on a cathode ray tube display, the position of one end of the display which is the sweep start point indicates correctly the reference signal frequency. However, the frequency at the sweep end point, that is, at the other end of the display is dependent on the linearity of the frequency characteristic of the variable frequency oscillator with respect to a control signal therefor, and if the linearity is poor, the frequency at the sweep end point is appreciably scattered; hence, the frequency cannot accurately be known. Further, in the case of using, as the reference frequency signal, the output from a reference frequency generator of a fixed frequency, for example, a crystal oscillator, the frequency at the sweep start point is fixed specifically to the reference frequency and the sweep start frequency cannot be set as desired. Moreover, if a synthesizer, for example, is employed to provide the output as the reference frequency signal, then the manufacturing cost of the sweep signal generating device becomes relatively high.

SUMMARY OF THE INVENTION

It is an object of the present invention to provide a sweep signal generating device in which frequencies at the start and end of the sweep are both accurately known.

Another object of the present invention is to provide a sweep signal generating device which permits setting the sweep start and stop frequencies correctly and with high accuracy and varying the set frequencies.

Another object of the present invention is to provide a sweep signal generating device in which the sweep start and stop frequencies are determined with high accuracy, and the width of the sweep, that is, the sweep time is made constant and, in addition, one or both of the sweep start and stop frequencies can be changed.

Yet another object of the present invention is to provide a sweep signal generator which facilitates the detection of frequencies at sweep start and end points and permits the synchronization of an actual sweep start frequency with a reference frequency with a relatively simple arrangement.

According to the present invention, the oscillation frequency of a variable frequency oscillator is swept and compared with a sweep start frequency set in start frequency setting means. When coincidence is detected between them, the sweep of the oscillation frequency of the variable frequency oscillator is stopped and, at the same time, a phase locked loop is set up for phase-synchronizing the oscillation frequency of the variable frequency oscillator with a reference frequency signal of a reference signal generator. When it is detected that a phase locked state is established by the phase locked loop, an error signal supplied to the variable frequency oscillator at that time is retained and the sweep of the oscillation frequency of the variable frequency oscillator is started again, cutting off the phase locked loop. When coincidence is detected between the output from the variable frequency oscillator and a sweep stop frequency set in stop frequency setting means, the sweep is stopped. As described above, in the present invention, the output from the variable frequency oscillator is frequency-swept at first and when the output frequency of the oscillator coincides with the sweep start frequency, it is phase-synchronized with the reference frequency, thereby to determine the sweep start point with high accuracy. Thereafter, the sweep of the output from the variable frequency oscillator is carried out again and when the output frequency of the oscillator coincides with the sweep stop frequency, the sweep is stopped. Accordingly, the sweep stop frequency is also highly accurate. Namely, the sweep start and stop frequencies are both highly accurate. The detection of coincidence of the oscillation frequency of the variable frequency oscillator with the sweep start and stop frequencies can be achieved on a digital or analog basis, and the phase locked loop for the reference frequency may be a digital or analog one. In the case of performing the coincidence detection on a digital basis, the frequency of the variable frequency is counted repeatedly by a counter, and when the count value of the counter coincides with the sweep start frequency, the coincidence is detected. In the case of phase-synchronizing the oscillation frequency with the reference frequency, the counter is so arranged as to be reset upon each coincidence of its count value with the sweep start frequency, and an output of the frequency which is obtained by frequency-dividing the output from the variable frequency oscillator by the sweep start frequency is obtained as the aforesaid coincidence detected output. This output is phase-compared with the reference frequency signal and the variable frequency oscillator is controlled by the phase-compared output so that they may coincide with each other. In this way, the coincidence detecting means and the phase locked loop means can be partly used in common and the sweep start frequency can be altered. In other words, it is possible to change the sweep start frequency while holding the oscillation frequency of the reference oscillator constant.

The sweep signal generator produces a constant ramp signal, the amplitude and level of which are adjusted by a scaling circuit in accordance with the sweep start and stop frequencies, and the output from the scaling circuit is applied as a control signal to the variable frequency oscillator. With such an arrangement, even if the sweep frequency range and the sweep start and stop frequencies are changed, there can be obtained a sweep signal of a constant sweep width, that is, a constant sweep time at all times. The scaling circuit may be of such an arrangement in which one of the ramp signal from the sweep signal generator and a signal opposite thereto in polarity but of the same level as the ramp signal is amplitude-adjusted in accordance with the sweep start frequency, while the other is amplitude-adjusted in accordance with the sweep stop frequency, and in which both amplitude-adjusted ramp signals are added together and the added output is level-shifted and applied as a control signal to the variable frequency oscillator.

Even if the frequency accuracy at the start of the sweep is not extremely increased by the phase locked loop, it is also possible to start the sweep at the moment of detection of the coincidence between the frequency of the variable frequency oscillator with the sweep start frequency and to take out the output from the variable frequency oscillator until the sweep frequency coincides with the sweep stop frequency. Likewise, it is possible to take out the output from the variable frequency oscillator from the moment of establishment of the phase locked state of the phase locked loop to the moment of detection of the coincidence between the sweep frequency and the sweep stop frequency. Furthermore, it is also possible to drive an auxiliary sweep signal generator from the moment of establishment of the phase locked state of the phase locked loop to the moment of detection of the coincidence between the sweep frequency and the sweep stop frequency so that a sweep signal is obtained from the auxiliary sweep signal generator.

DETAILED DESCRIPTION OF THE PREFERRED EMBODIMENTS

Figure 1:
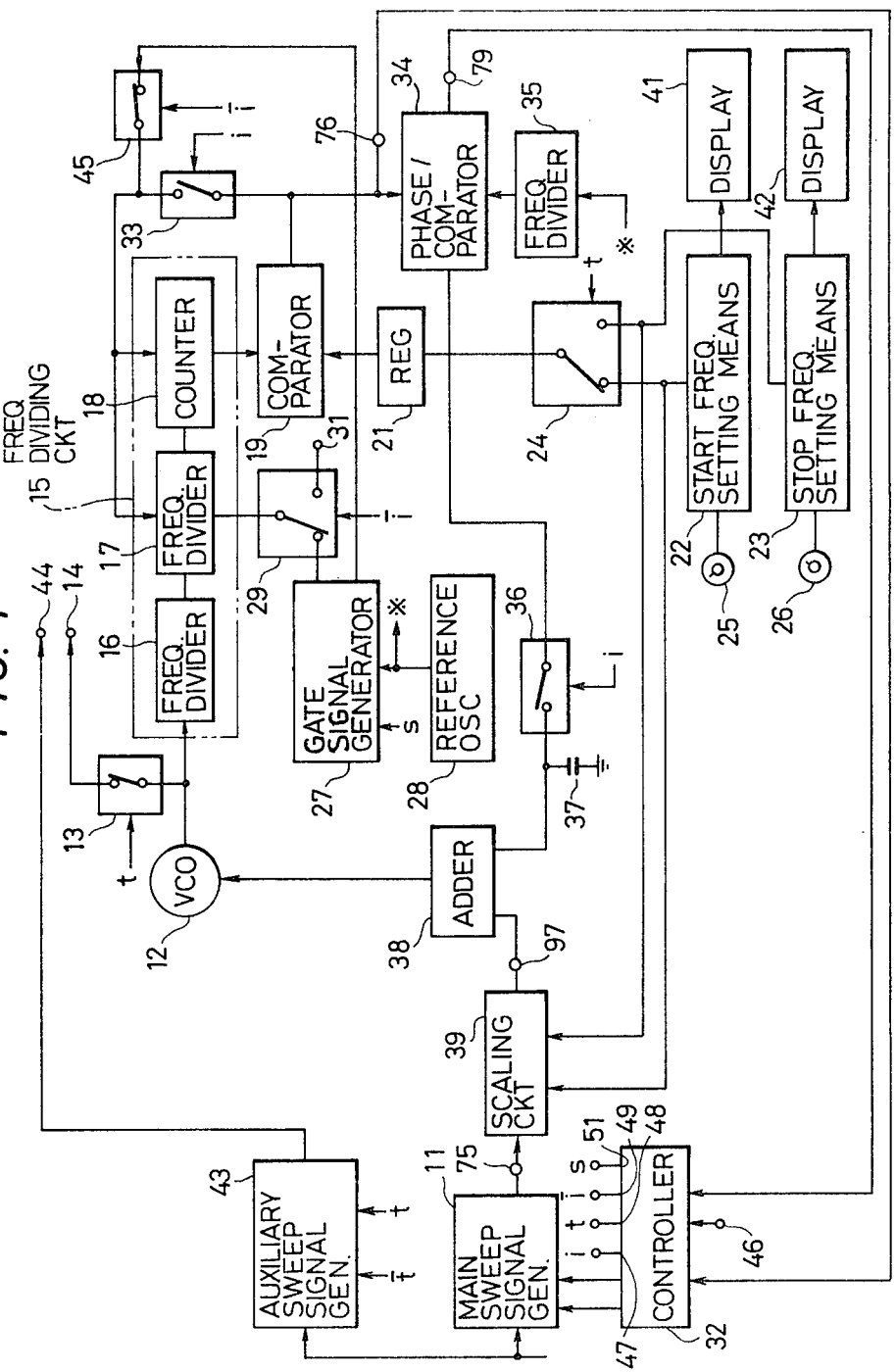
FIG. 1 is a block diagram illustrating an embodiment of the sweep signal generating device of the present invention.

Referring first to FIG. 1, a sweep signal generator 11 provides, for example, a ramp voltage to a variable frequency oscillator 12, for instance, a voltage-controlled oscillator (hereinafter referred to simply as VCO) to control it, deriving therefrom a signal whose frequency is swept. The output from the VCO 12 is applied via a switch 13 to an output terminal 14 to derive therefrom a frequency-swept signal. At the same time, the output from the VCO 12 is frequency-divided by a frequency dividing circuit 15 for the detection of its coincidence with a set frequency and for phase synchronization by a phase locked loop. In the frequency dividing circuit 15, the output from the VCO 12 is frequency-divided by, for example, a frequency divider 16 and is further frequency divided by a frequency divider 17 down to, for instance, 1/10. The output from the frequency divider 17 is provided to a 4-digit, binary-coded decimal counter 18, the count content of which is derived as the output from the frequency dividing circuit 15. The output therefrom is applied to a comparator 19, which compares it with the content of a register 21 and, in the case of coincidence, yields a coincidence signal. In the register 21 is set one of the frequencies set in a start frequency setting means 22 and a stop frequency setting means 23 which are selected by a change-over switch 24.

The start frequency setting means 22 is provided with, for example, an up-down counter and is arranged so that, by turning a set knob 25 to the right or left, or by turning it up or down, the up-down counter is controlled to perform a counting-up or counting-down operation to set a desired frequency. It is also possible to set each digit of the set frequency by means of a multi-digital switch. Likewise, the stop frequency setting means 23 is also provided with an up-down counter and arranged so that the counter is controlled by operating a set knob 26, thereby to set a desired frequency; also in this case, the stop frequency setting means 23 may be constituted by a multi-digit digital switch. The detection of the coincidence mentioned before is performed as follows. A gate signal generator 27 is supplied with a signal from a reference oscillator 28 which has a high degree of accuracy in its oscillation frequency, using a crystal oscillator element, for example. Based on the signal from the reference oscillator 28, the gate signal generator 27 yields periodic gate signals each separated from the adjacent one with a short time interval. The gate signals are each applied via a switch 29 to the frequency dividing circuit 15, and in the duration of the gate signal, the count value of the counter 18 and the content of the register 21 are compared with each other to detect the coincidence between the oscillation frequency of the VCO 12 and the frequency set in the register 21. The frequency divider 17 has an enable terminal E and while supplied with the gate signal at the enable terminal E from the gate signal generator 27, the frequency divider 17 performs its frequency dividing operation but stops the operation in the interval between the individual gate signals. In the case where the switch 29 is held on the side of a terminal 31, a constant voltage Vc is provided from the terminal 31 to the enable terminal E to put the frequency divider 17 in its operative state. At the end of each gate signal the frequency divider 17 and the counter 18 are reset through a switch 45.

When the content of the register 21 and the count content of the counter 18 coincide with each other in the state in which the gate signal is supplied from the gate signal generator 27 to the enable terminal E of the frequency divider 17 and the counter 18 performs its counting operation, the comparator 19 yields an output, which is applied via a terminal 76 to a controller 32. In the case where the frequency set in the register 21 is a sweep start frequency, the sweep of the sweep signal generator 11 is stopped upon application of the output from the comparator 19 to the controller 32, providing a phase synchronization state in which the VCO 12 is phase-synchronized with the reference oscillator 28 via a frequency divider 35.

Namely, the switch 29 is connected to the side of the terminal 31 and the frequency divider 17 is held operative. Upon each coincidence of the content of the counter 18 with the content of the register 21, the comparator 19 provides a coincidence output, which is applied via a switch 33 to the frequency divider 17 and the counter 18 to reset them. In this way, each time the contents of the counter 18 and the register 21 coincide with each other, the comparator 19 yields the coincidence output; namely, the comparator 19 provides a signal obtained by frequency dividing the output from the frequency divider 17 by the content of the register 21. The signal thus derived from the comparator 19 is supplied to a phase comparator 34. To the phase comparator 34 is provided, as a reference signal, an output signal from the frequency divider 35 in which the output from the reference oscillator 28 is frequency-divided, and in the phase comparator 34 the output from the comparator 19 is phase-compared with the reference signal. The resulting comparison error signal is stored in a capacitor 37 via a switch 36 and, at the same time, it is applied as a control signal to the VCO 12 via an adder 38. The control signal from the sweep signal generator 11 is provided via a scaling circuit 39 to the adder 38, wherein it is added with an error signal stored in the capacitor 37 in a phase lock loop, and the added output from the adder 38 is applied as a control signal to the VCO 12.

The scaling circuit 39 is to adjust the output of the sweep signal generator 11 to an amplitude and a bias level corresponding to the sweep start and stop frequencies set in the frequency setting means 22 and 23. By this adjustment, there can be obtained an output which is constant in the sweep signal width, i.e. the sweep time, regardless of the values set in the frequency setting means 22 and 23. The set contents of the frequency setting means 22 and 23 are respectively provided to displays 41 and 42, wherein the set start and stop frequencies are displayed. In this embodiment, an auxiliary sweep signal generator 43 is provided in addition to the sweep signal generator 11. The auxiliary sweep signal generator 43 provides a sweep signal at an output terminal 44 when the phase locked loop has established the phase synchronization. The establishment of the phase synchronization by the phase locked loop is detected by the phase comparator 34 and the detection signal is applied via a terminal 79 to the controller 32. The detection of the establishment of the phase synchronization can be effected in the same manner as is disclosed in the aforementioned U.S. patent.

The controller 32 starts its operation in response to an initial reset command from a terminal 46 and receives the output from the comparator 19 via the terminal 76 and the output from the phase comparator 34 via the terminal 79. The controller 32 controls the switches 33 and 36 by the output at its output terminal 47, the switches 13 and 24 by the output at its output terminal 48, the switches 29 and 45 by the output at its output terminal 49 and the gate signal generator 27 by the output at its output terminal 51.

Figure 2:
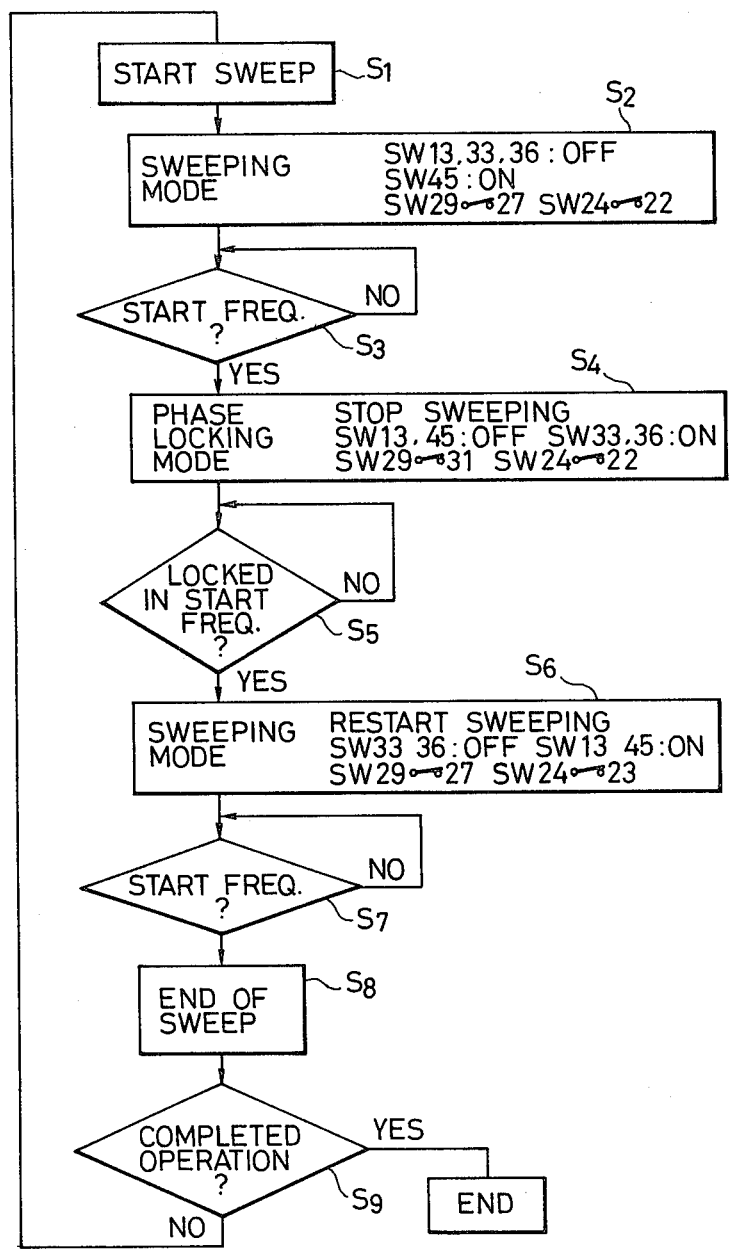
FIG. 2 is a flowchart explanatory of the operation of the sweep signal generating device of the present invention.
Figure 3A:
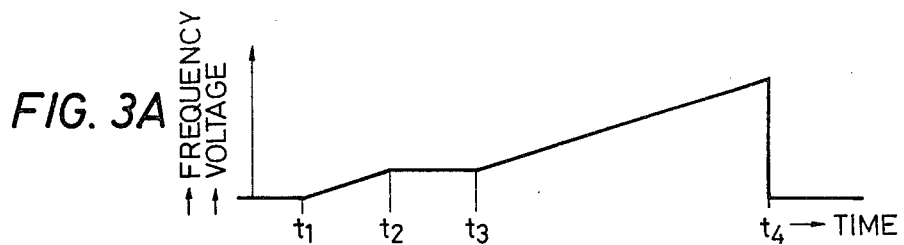
FIGS. 3A to 3C, inclusive, are timing charts explanatory of the operation of the embodiment shown in FIG. 1.

The device illustrated in FIG. 1 performs such an operation as shown in FIG. 2. The operation begins with step $S_1$ in which the sweep signal generator 11 starts its sweep operation upon application of the initial reset command to the terminal 46 of the controller 32. That is, as shown in FIG. 3A, upon application of the initial reset command at a moment $t_1$, the output voltage V of the sweep signal generator 11 starts to increase. Accordingly, the output frequency F of the VCO 12 also varies in a certain direction correspondingly, as shown in FIG. 3A. This is a sweep mode, in which, as shown in step $S_2$ in FIG. 2, the switches 13, 33 and 36 are turned OFF, the switch 45 is turned ON, the switch 29 is connected to the side of the gate signal generator 27 and the switch 24 is connected to the side of the start frequency setting means 22. As a consequence, in step $S_2$ the gate signals are applied from the gate signal generator 27 to the frequency dividing circuit 15 at a rate sufficiently higher than the sweep signal, and the content of the counter 18 is repeatedly compared with the start frequency set in the register 21 until they coincide with each other. Upon detection of the coincidence, the operation proceeds to a phase synchronization mode, as shown in step $S_4$ in FIG. 2.

In this mode, as shown in FIG. 3A, the sweep of the sweep signal is stopped at a moment $t_2$ and the output voltage V of the sweep signal generator 11 is held at the value at the moment $t_2$, and consequently the oscillation frequency F of the VCO 12 is also retained at the value at that moment.

Figure 4:
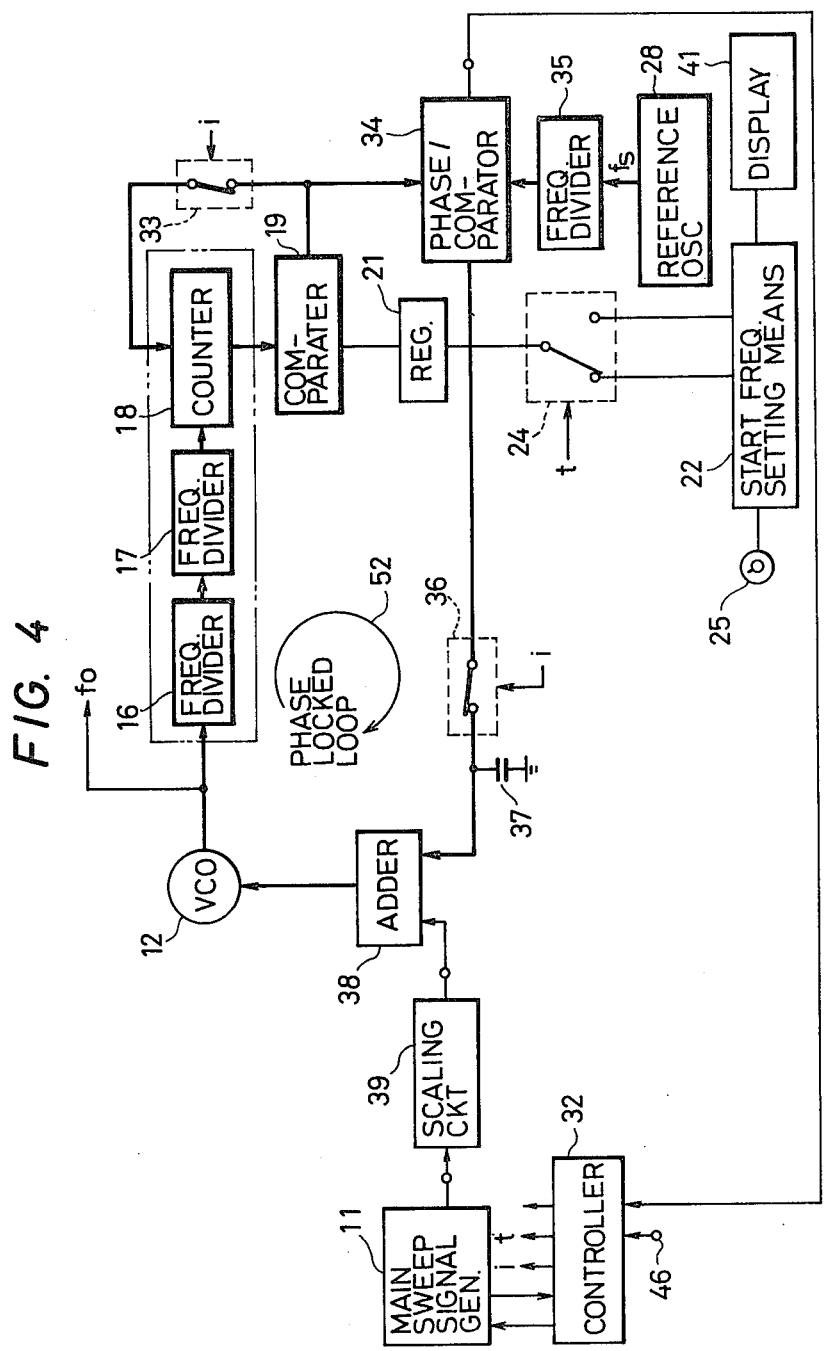
FIG. 4 is a block diagram showing the state in which the sweep signal generating device of FIG. 1 is set to a phase synchronization mode.

In the phase synchronization mode, the switches 13 and 45 are turned OFF, the switches 33 and 36 are turned ON, the switch 24 is connected to the side of the start frequency setting means 22 and the switch 29 is connected to the side of the terminal 31. In this mode, the device of FIG. 1 is in such a state as depicted in FIG. 4, in which the frequency divider 17 is always operative; accordingly, the output from the VCO 12 is frequency-divided by the frequency dividers 16 and 17; upon each coincidence of the count content of the counter 18 with the start frequency set in the register 21, the comparator 19 yields an output to reset the counter 18; the output from the comparator 19 is phase-compared by the phase comparator 34 with the reference signal from the frequency divider 35; and the resulting error signal is stored in the capacitor 37 and is also applied as a control signal to the VCO 12 via the adder 38. In this manner, a phase lock loop 52 is set up. Letting the oscillation frequency of the VCO 12 be represented by $f_0$, the frequency dividing numbers of the frequency dividers 16 and 17 by $D_1$ and $D_2$, respectively, the start frequency set in the register 21 by N, the reference frequency of the oscillator 28 by $f_s$ and the frequency dividing number of the frequency divider 35 by $D_m$, the phase lock loop 52 operates in such a manner that $$f_0 = D_1 \times D_2 \times N \times (f_s/D_m)$$

For example, in the case where $D_1$ and $D_2$ are both 10, $D_m$ is 1000, $f_s$ is 10 MHz and N is in the range of 2000 to 4000, then $f_0$ takes a value in the range of 2000 to 4000 MHz and, by varying N to desired integer values in the range of 2000 to 4000, the oscillation frequency $f_0$ of the VCO 12 can be phase-synchronized with the reference signal by steps of 1 MHz. As will be understood from this, a number in the range of 2000 to 4000 in this example is set as a set frequency in each of the start frequency setting means 22 and the stop frequency setting means 23, and the number set in each setting means represents the actual start or stop frequency in units of MHz. In the phase synchronization mode, as shown in step $S_5$ in FIG. 2, it is repeatedly checked whether the phase synchronization has been established by the phase lock loop, and when the establishment of the phase synchronization is detected by the phase detector 34, the operation goes back again to the sweep mode at that moment $t_3$.

Figure 3B:
Figure 3C:

That is, in step $S_6$ in FIG. 2, the sweep mode re-starts to resume the sweep operation of the sweep signal generator 11. In this sweep mode, the switch 24 is connected to the side of the stop frequency setting means 23 and the switch 13 is turned ON unlike in the sweep mode in step $S_2$; but the other switches are held in the same state as in step $S_2$. Accordingly, the output voltage V of the sweep signal generator 11 starts to gradually increase from the moment $t_3$, as shown in FIG. 3A, and the frequency F of the VCO 12 also gradually increases correspondingly. At this time, the switch 13 is turned ON, as shown in FIG. 3B, and the output from the VCO 12 is derived at the output terminal 14 and, at the same time, the control signal for the switch 13 is also supplied to the auxiliary sweep signal oscillator 43 to derive therefrom such a sweep signal as that depicted in FIG. 3C. On the other hand, upon setting up the sweep mode in step $S_6$, the stop frequency is set in the register 21 and compared with the count content of the counter 18, and in step $S_7$, their coincidence is repeatedly checked. Upon detection of their coincidence, the detected output is provided to the controller 32 at that moment $t_4$ to stop the sweep as shown in step $S_8$; namely, as shown in FIGS. 3A and 3C, the sweep signal generators 11 and 43 finish their sweep operation and are reset and, as shown in FIG. 3B, the switch 13 is turned OFF. In the case of repeating the sweep, it is checked in step $S_9$ whether the sweep has been finished or not, and when the end of the sweep is detected, the operation returns to step $S_1$ to start the sweep, thus repeating the abovesaid operations.

As described above, in the present invention, the VCO 12 is frequency-swept and when its frequency coincides with the preset start frequency, the frequency is further caused by the phase synchronization to agree with the start frequency in terms of the accuracy of the reference signal and the sweep is started with the start frequency and stopped upon detection of coincidence of the frequency of the VCO 12 with the preset stop frequency. As a consequence, the sweep stop frequency is also highly accurate without being affected by the linearity of the oscillation frequency of the VCO 12 with respect to the control voltage, thus ensuring that the start and stop of the sweep take place accurately at the preset frequencies. For example, assuming that the oscillation frequency of the VCO 12 is swept in the range of 2000 to 4000 MHz, as referred to previously, that the output from the VCO 12 is frequency-divided by each of the frequency dividers 16 and 17 down to 1/10, that the sweep time is about 500 msec, and that the pulse width of the gate signal from the gate signal generator 27 is 100 $\mu$s, the counter 18 can repeat counting about 5000 times in one sweep time of about 500 msec. Since the width of the sweep frequency is 2000 MHz, the counting takes place substantially every 400 KHz. Accordingly, a 4-digit counter is employed as the counter 18 and its content is compared by the comparator 19 with the content of the register 21, using four digits. In this example, the comparison in the comparator 19 can be done with a resolution of 1 MHz. In this way, the oscillation frequency of the VCO 12 can be brought into agreement with the start or stop frequency with an accuracy less than 1 MHz in the direction of the sweep. In the prior art, a frequency accurate only to $\pm 1\%$ of the width of the sweep frequency is obtainable so that in the case of the width of the sweep frequency being 2000 MHz, an error of $\pm 20$ MHz appears at the start or end of the sweep. With the device of the present invention, however, the start and stop of the sweep can be set with accuracy less than 1 MHz in the direction of sweep. In addition, in this example, since the phase synchronization is effected by the phase lock loop in terms of the frequency of the reference oscillator 28 after the detection of coincidence of the oscillation frequency of the VCO 12 with the start frequency, the sweep start frequency has a high degree of accuracy. The lower the sweep speed becomes and the narrower the width of the sweep frequency becomes, the more the setting accuracy for the coincidence of the frequencies increases. Further, the accuracy of detection of the coincidence can be enhanced by reducing the width of the gate signal from the gate signal generator 27, speeding up the operations of the frequency divider 17 and the counter 18 and increasing the number of digits of each of the counter 18, the comparator 19 and the register 21.

Figure 5:
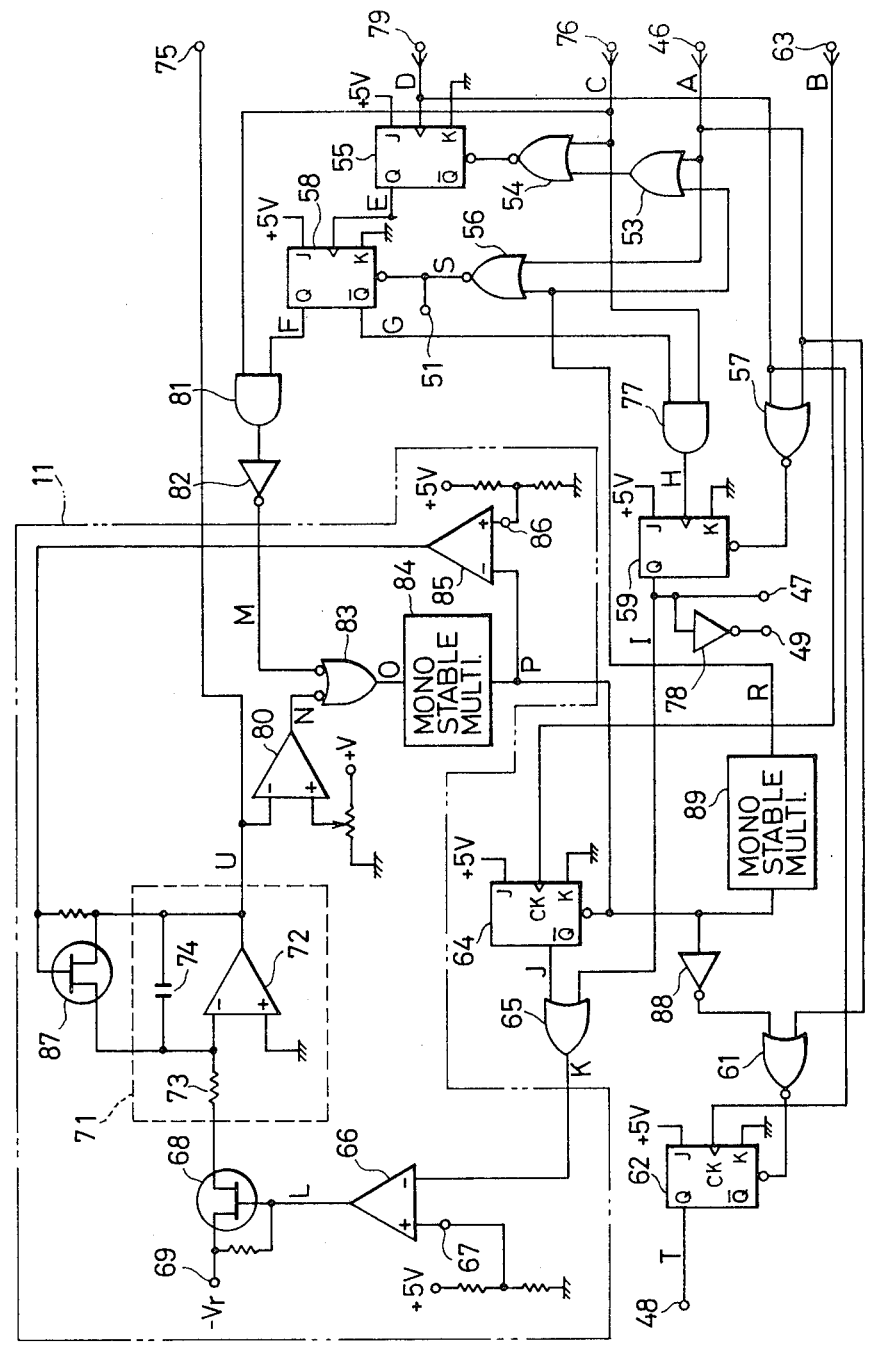
FIG. 5 is a circuit diagram showing a specific circuit arrangement of a controller 32 utilized in the embodiment of FIG. 1.
Figure 6:
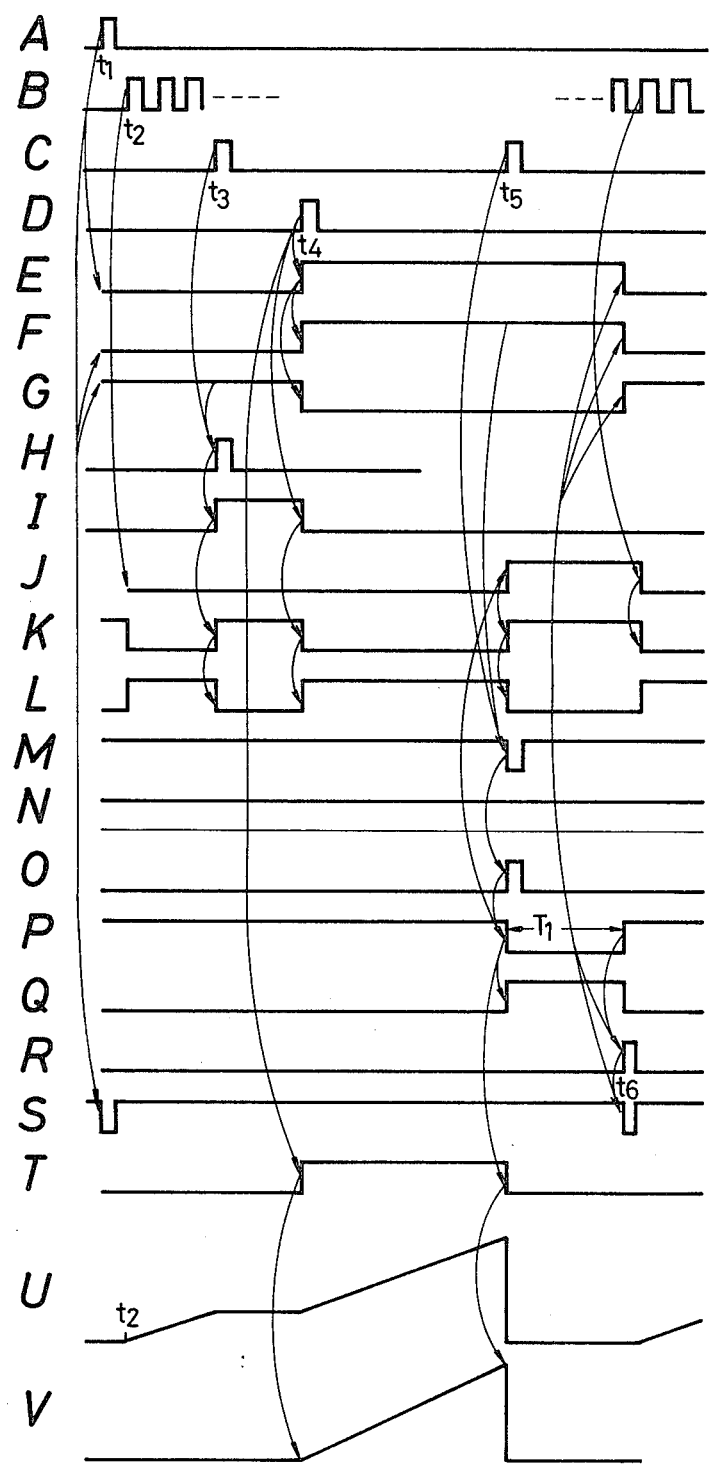
FIG. 6 is a timing chart explanatory of the operation of the controller shown in FIG. 5.

A specific example of the controller 32 employed in the embodiment of FIG. 1 is shown in FIG. 5 and its operation will be described with reference to FIG. 6. In FIG. 5, upon application of an initializing pulse from the terminal 46 at the moment $t_1$, as shown in FIG. 6A, a flip-flop 55 is reset by the pulse via an OR circuit 53 and a NOR circuit 54, making the Q output of the flip-flop 55 low-level, as shown in FIG. 6E. Likewise, the initializing pulse is applied via NOR circuits 56 and 57 to flip-flops 58 and 59 to reset them, making their Q outputs low-level, as depicted in FIGS. 6F and 6I. Furthermore, the initializing pulse from the terminal 46 is similarly provided via a NOR circuit 61 to a flip-flop 62 to reset it, making its Q output low-level, as shown in FIG. 6T. In FIG. 5, it is assumed that the flip-flops are each controlled when its J input changes from the lower level to the higher one. At a moment $t_2$ immediately after the moment $t_1$ of occurrence of the initializing pulse, a clock pulse (FIG. 6B) is provided from a terminal 63 to a clock terminal CK of a flip-flop 64 to make its Q output low-level, and the low level is applied via an OR circuit 65 to an inverting input side of a comparator 66, which compares it with a reference voltage applied thereto from a terminal 67 and provide to the gate of a FET switch 68 such a high level as shown in FIG. 6L. As a result of this, a reference voltage $-Vr$ applied to a terminal 69 is provided via the FET switch 68 to an integrator circuit 71. The integrator circuit 71 comprises an operational amplifier 72, an input integrating resistor 73 and an integrating capacitor 74 connected between the input and output of the integrator circuit 71. The output from the integrator circuit 71 is derived at an output terminal 75, and the output at this output terminal 75 starts to gradually increases from the moment $t_2$, as shown in FIG. 6U.

In this state, when the coincidence of the oscillation frequency of the VCO 12 with the start frequency is detected by the comparator 19 shown in FIG. 1, a coincidence detection pulse such as depicted in FIG. 6C is supplied from a terminal 76 in FIG. 5 to an AND circuit 77. Since the AND circuit 77 is supplied with the high level of the Q output of the flip-flop 58 as shown in FIG. 6G, a pulse is provided at the output of the AND circuit 77 at a moment $t_3$ when the coincidence detection signal is obtained, as depicted in FIG. 6H. By this pulse the flip-flop 59 is driven and its Q output is made high-level at the moment $t_3$ as shown in FIG. 6I. This high-level Q output is applied as a control signal to each of the switches 33 and 36 in FIG. 1 to turn it ON, thus setting up the phase locked loop 52. Further, the signal at the terminal 47 is supplied via an inverter 78 to the terminal 49 to obtain a signal I in FIG. 1, by which signal the switch 45 is turned OFF and the switch 29 is changed over to the side of the terminal 31. The high level of the Q output of the flip-flop 59 is applied via the OR circuit 65 to the comparator 66. Since this high level is higher than the reference voltage at the terminal 67, the output from the comparator 66 becomes low level, as shown in FIG. 6L, turning OFF the FET switch 68. As a consequence, the output from the integrator circuit is retained constant.

In this way, the phase synchronization control state is set up by the phase locked loop 52.

Thereafter, when the establishment of the phase synchronization is detected by the phase comparator 34 at a moment $t_4$ as shown in FIG. 6D, a synchronization establishment detected pulse is provided from a terminal 79 in FIG. 5 to the flip-flop 55 to make its Q output high-level, as shown in FIG. 6E. By this output, the flip-flop 58 is driven to make its Q output high-level, as shown in FIG. 6F, and this output is applied to an AND circuit 81 to permit the passage therethrough of the next coincidence detected output. The synchronization establishment detected signal from the terminal 79 is provided via the NOR circuit 57 to the flip-flop 59 to reset it and its Q output becomes low-level, as shown in FIG. 6I. This low-level output is applied via the OR circuit 65 to the comparator 66 to conduct the FET switch 68 again, resuming the integration in the integrator circuit 71 at the moment $t_4$, as depicted in FIG. 6U. At the moment $t_4$, the synchronization establishment detected pulse from the terminal 79 drives the flip-flop 62 to make its Q output high-level, as depicted in FIG. 6T, and this output is applied to the switches 13 and 24. As a result of this, the output from the VCO 12 is provided to the output terminal 14 and the stop frequency is set in the register 21 in FIG. 1. Further, the signal at the terminal 48 is supplied to the auxiliary sweep signal generator 43 to start its sweep operation, as shown in FIG. 6V. The auxiliary sweep signal generator 43 is identical in construction with the sweep signal generator 11 illustrated in FIG. 5, and the start and stop of the sweep and the reset of the integrator circuit are controlled by the signal (FIG. 6T) at the terminal 48 and its inverted signal.

In this way, a sweep signal is generated and a frequency-swept signal of the VCO 12 is taken out. When coincidence is detected by the comparator 19 in FIG. 1 between the oscillation frequency of the VCO 12 and the stop frequency at a moment $t_5$, as shown in FIG. 6C, the coincidence detection pulse is applied from the terminal 76 to the AND circuit 81. Since the AND circuit 81 is supplied with the high level of the Q output of the flip-flop 58 as mentioned previously, the detection pulse passes through the AND circuit 81 and is inverted by an inverter 82 into such a pulse as depicted in FIG. 6M. This inverted pulse is provided to an OR circuit 83, from which such a pulse as shown in FIG. 6O is applied to a monostable multivibrator 84, deriving therefrom such an output as shown in FIG. 6P which remains low-level for a certain period of time $T_1$. This output is supplied to a comparator 85, wherein it is compared with a reference voltage at a terminal 86, and the output from the comparator 85 becomes high-level for the period of time $T_1$, as depicted in FIG. 6Q. By the high-level output from the comparator 85, a FET switch 87 is conducted to short-circuit the integrating capacitor 74, thus resetting the integrator circuit 71. As a consequence, the sweep signal drops to a reference potential point at a moment $t_5$, as shown in FIG. 6U. A comparator 80 is provided to reset automatically the integration circuit 71 at a predetermined maximum sweep signal voltage even when the stop frequency coincidence signal is not supplied to the monostable multivibrator 84 from the AND circuit 81. By the output from the monostable multivibrator 84, the flip-flop 64 is reset t make its Q output high-level, as depicted in FIG. 6J. Further, the output from the monostable multivibrator 84 is provided via an inverter 88 and the NOR circuit 61 to the flip-flop 62 to reset it, making its Q output low-level, as illustrated in FIG. 6T. Consequently, the sweep of the auxiliary sweep signal generator 43 is reset, as shown in FIG. 6V. At a moment $t_6$ when the output from the monostable multivibrator 84 rises from the lower level to the higher one, a monostable multivibrator 89 is driven by the high-level output to generate a pulse, as depicted in FIG. 6R, which pulse is applied via the NOR circuit 56 to the flip-flop 58 to reset it. Similarly the output from the monostable multivibrator 89 is provided via the OR circuit 53 and the NOR circuit 54 to the flip-flop 55 to reset it. Thus, the device is put in its initial state and, by the next clock applied to the terminal 63, the integrator circuit 71 is started again to perform its integrating operation, and the abovesaid operations are repeated. The output from the NOR circuit 56 is provided, in such a form as shown in FIG. 6S, to the gate signal generator 27 in FIG. 1 via a terminal 51 and while this signal assumes a high level, the gate signal generator 27 is held operative.

Figure 7:
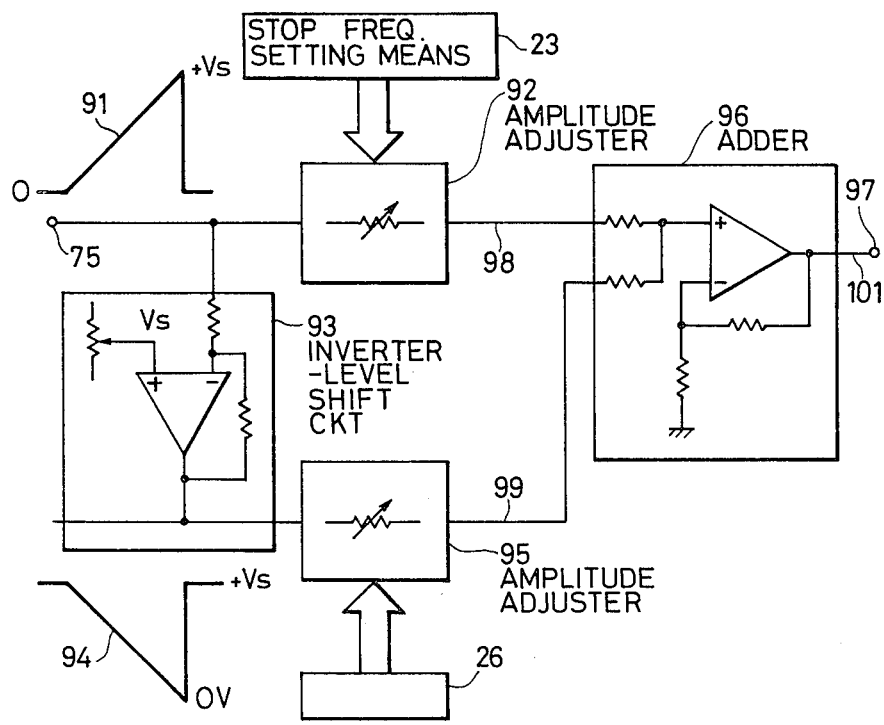
FIG. 7 is a circuit diagram illustrating an example of a scaling circuit 39 employed in the embodiment of FIG. 1.

The scaling circuit 39 in FIG. 1 has, for example, such an arrangement as illustrated in FIG. 7. A ramp voltage signal 91 from the sweep signal generator 11 is applied via a terminal 75 to an amplitude (rate of rise) adjuster (or converter) 92 and a polarity inverter-level shift circuit 93. The ramp voltage is, for example, such a voltage that varies up to $+V_S$ from zero volts. The polarity inverter-level shift circuit 93 is, for instance, a subtractor circuit, which is supplied at its non-inverting input side with a constant signal of $+V_S$ volts and at its inverting input side with the ramp voltage signal 91 from the terminal 75. Accordingly, the polarity inverter-level shift circuit 93 yields such an output as indicated by a signal 94 which is $+V_S$ volts in the case of the signal 91 being 0 volts and 0 volts in the case of the signal 91 being $+V_S$ volts; namely, this output is a polarity-inverted signal of the signal 91 but level-shifted to the positive side by $V_S$ volts. The output signal from the polarity inverter-level shift circuit 93 is applied to an amplitude adjuster 95. The amplitude adjusters 92 and 95 are each capable of amplitude adjustment, for example, by a digital signal and formed by a variable gain adjuster or variable attenuator. As the digital signals for amplitude control use, signals representing the stop frequency and the start frequency are respectively applied to the amplitude adjusters 92 and 95 from the stop and start frequency setting means 23 and 22. The outputs from the amplitude adjusters 92 and 95 are added together by an adder 96 to derive a desired output at its output terminal 97.

Figure 8A:
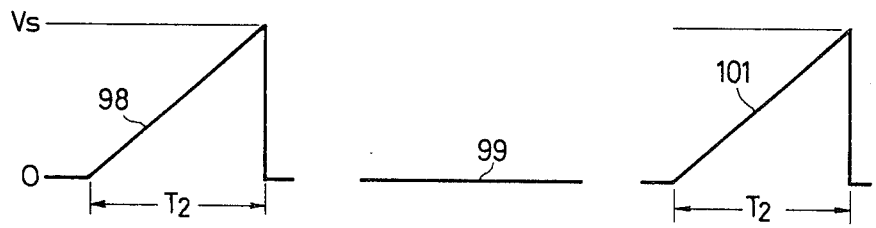
FIGS. 8A to 8D, inclusive, are waveform diagrams showing an example of the operation of the scaling circuit 31 depicted in FIG. 7.
Figure 8B:
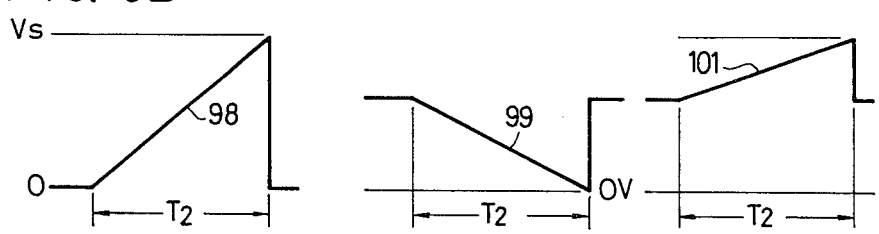
Figure 8C:
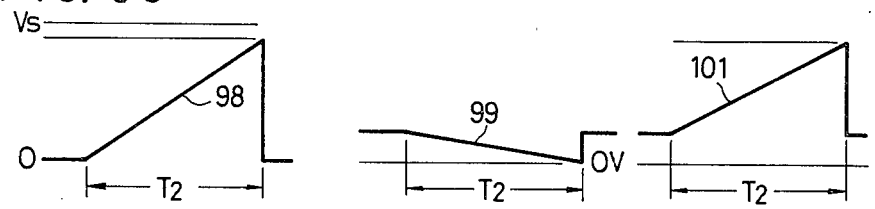
Figure 8D:
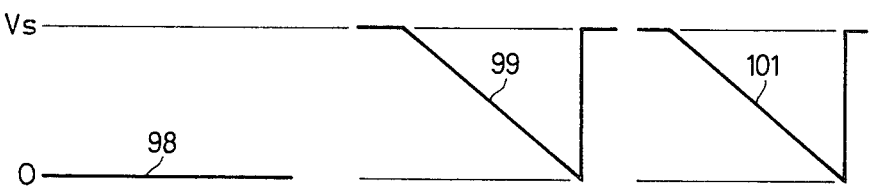

Letting the outputs from the amplitude adjusters 92 and 95 be represented by 98 and 99, respectively, and the output at the output terminal 97 be represented by 101 and assuming, for example, that the amplitude adjuster 92 outputs the input signal as it is, as indicated by 98 in FIG. 8A, and that the output 99 from the amplitude adjuster 95 is zero, as depicted in FIG. 8A, the output 98 appears as the added output 101, as illustrated in FIG. 8A. In the case where the amplitude adjuster 92 is adapted to output the input signal as it is and the amplitude adjuster 95 is adjusted to reduce the amplitude of the input, as shown in FIG. 8B, the added output 101 of the outputs 98 and 99 becomes such a signal as shown in FIG. 8B which sweeps from a certain level to $V_S$. When the amplitude adjusters 92 and 95 are both adjusted to decrease the amplitudes of their inputs, as depicted in FIG. 8C, the added output 101 becomes such a signal whose lower level is higher than the zero level and whose higher level is lower than $V_S$. In the case where the output 98 from the amplitude adjuster 92 is zero and the amplitude adjuster 95 outputs the input signal as it is, as depicted in FIG. 8D, the added output 101 becomes such a signal that varies from $V_S$ to zero. In this manner, the sweep starting and stopping levels can be arbitrarily selected between O and $V_S$ although the sweep period $T_2$ is constant. For example, in the case where the sweep frequency is selected in the range of 2000 to 4000 MHz, the control signal is 2000 MHz at the zero level and 4000 MHz at $V_S$ volts, the sweep period is $T_2$ and the start and stop frequencies are set to values between 2000 to 4000 MHz, even if the start and stop frequencies are changed, and the sweep period $T_2$ can be held constant.

Figure 9:
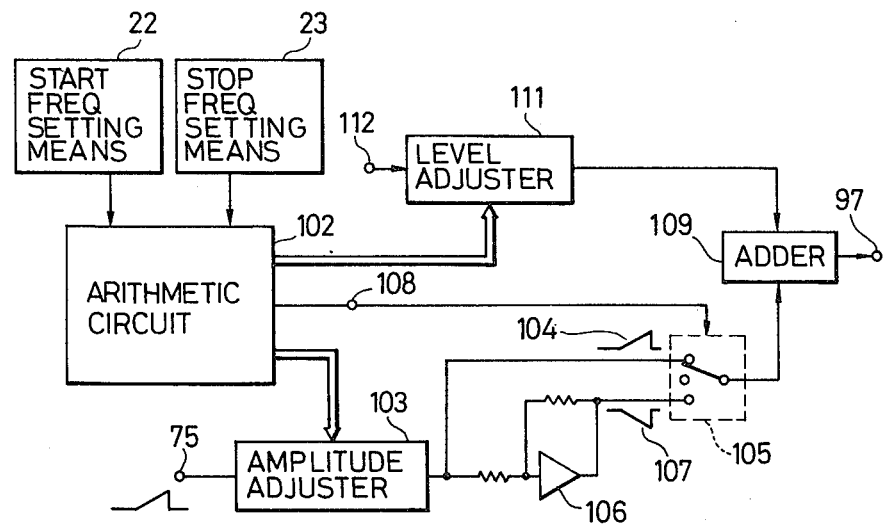
FIG. 9 is a circuit diagram illustrating another example of the scaling circuit 39.

Another example of the scaling circuit 39 is illustrated in FIG. 9, in which the signals representing the start and stop frequencies are applied from the frequency setting means 22 and 23 to an arithmetic circuit 102, from which a signal corresponding to the frequency of a difference between the start and stop frequencies is applied as a control signal to an amplitude adjuster 103. The amplitude adjuster 103 is able to adjust the amplitude of the input thereto digitally as is the case with the amplitude adjusters 92 and 95 described above in connection with FIG. 7. The output from the sweep signal generator 11 is applied via the terminal 75 to the amplitude adjuster 103, wherein it is adjusted in amplitude. The output from the amplitude adjuster 103 is applied as a signal 104 to one input terminal of a change-over switch 105 and, at the same time, it is polarity-inverted by a polarity inverter 106 and provided as a signal 107 to the other input terminal of the change-over switch 105. The output from the change-over switch 105 is supplied to an adder 109. A signal representing the sign of the difference between the start and stop frequencies is provided from the arithmetic circuit 102 via a terminal 108 to the change-over switch 105 to control its change-over operation. The change-over switch 105 is controlled so that it selects the signal 104 or 107 depending on whether the start frequency is lower or higher than the stop frequency. The sweep signal selected by the change-over switch 105 is provided to the adder 109. On the other hand, a signal corresponding to the start frequency is applied to a level adjuster 111 from the arithmetic circuit 102. To the level adjuster is provided a constant bias level from a terminal 112, which level is set to a start level. The output from the level adjuster 111 is applied to the adder 109 to derive therefrom at its output terminal 97 a sweep signal which increases or decreases from a level of the start frequency to a level of the stop frequency in accordance with the preset start and stop frequencies and whose sweep time is $T_2$.

Figure 10:
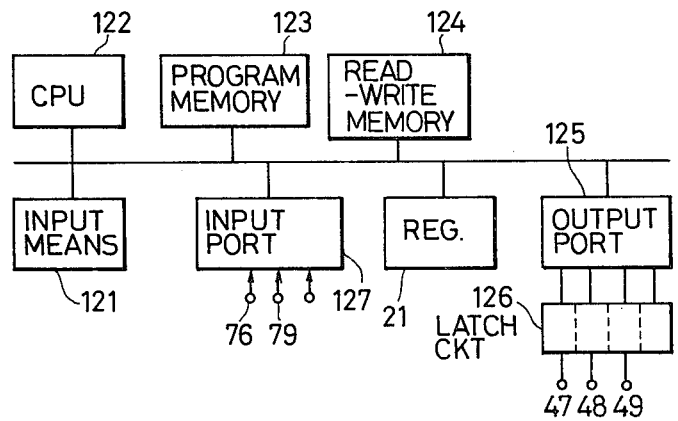
FIG. 10 is a block diagram illustrating another example of the controller 32.

The controller 32 employed in the embodiment of FIG. 1 may also be constituted by a microcomputer. For example, as shown in FIG. 10, the start and the stop frequencies are entered from input means 121 of the microcomputer such, for example, as a keyboard, encoder, digital switch or the like. A central processor unit 122 reads out, interprets and executes a program from a program memory, by which the set frequencies from the input means are stored in predetermined areas of a read-write memory 124. At the start of the sweep, the start frequency stored in the memory 124 is set by the central processor unit 122 in the register 21 and switch control signals for the terminals 47, 48 and 49 are latched in a latch circuit 126 through an output port 125. Further, a control signal for the sweep signal generator 11, such as described previously with regard to FIG. 5, is also latched in the latch circuit 126. From an input port 127 is taken in the frequency coincidence signal at the terminal 76 and the phase synchronization establishment detection signal at the terminal 79, and the switch control signals corresponding to the above signal are latched by the processing of the central processor unit 122 in the latch circuit 126. This can be achieved by describing a program in advance in the program memory 123 so that the flowchart shown in FIG. 2 is executed. The switch control signals can easily be obtained for instance by providing a flag in the first sweep in the program but removing it in the second sweep. Accordingly, the operations described previously with respect to FIG. 2 can be executed.

Figure 11:
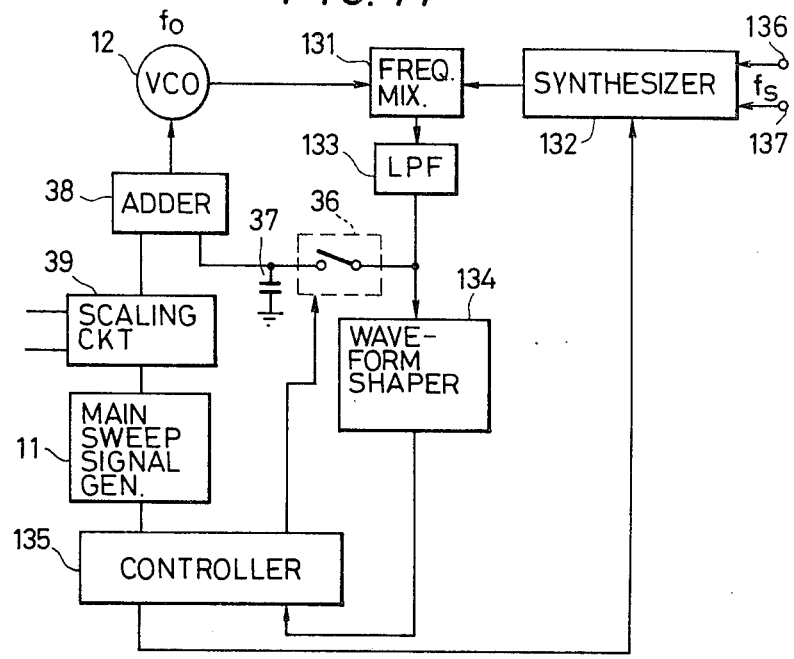
FIG. 11 is a block diagram illustrating another embodiment of the sweep signal generating device of the present invention.

It is also possible to detect the coincidence between the output frequency of the VCO 12 and the start or stop frequency and/or to form the phase lock loop purely on an analog basis. For example, as shown in FIG. 11, the output from the VCO 12 is applied to a frequency mixer 131, wherein it is frequency-mixed with a start frequency signal from a synthesizer 132. The output from the frequency mixer 131 is supplied to a low-pass filter 133, which produces an output when a frequency difference between the output signal of the VCO 12 and the start frequency signal from the synthesizer 132 becomes smaller than a predetermined value, and the output from the low-pass filter 133 is waveform-shaped by a waveform shaper 134 and then provided to a controller 135. Upon receiving the input, the controller 135 turns ON the switch 36 to set up the phase lock loop. That is, when the switch 36 is turned ON, phase and frequency error signals between the output from the VCO 12 and the start frequency signal of the synthesizer 132 are applied through the low-pass filter 133 to the capacitor 37 and, at the same time, they are provided via the adder 38 to a control terminal of the VCO 12 to control it to oscillate at the start frequency. Upon detection of the establishment of this synchronization, the controller 135 turns OFF the switch 36 and controls the sweep signal generator 11 to start the sweep operation. The resulting sweep signal is added by the adder 38 with the error signal stored in the capacitor 37 and the added output is provided to the control terminal of the VCO 12. Thereafter, the controller 135 controls the synthesizer 132 to derive therefrom the stop frequency signal. The stop frequency signal and the output signal from the VCO 12 are frequency-mixed in the frequency mixer 131, and when they coincide with each other, the waveform shaper 134 yields an output and the controller 135 stops the sweep signal generator 11 from sweeping. The synthesizer 132 is arranged to yield the start and the stop frequencies in accordance with inputs to terminals 136 and 137, respectively.

Figure 12:
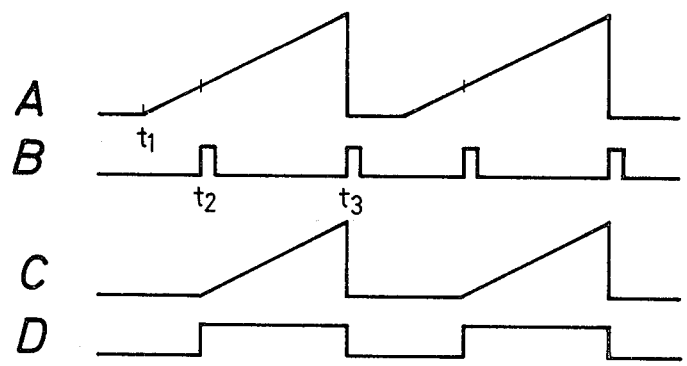
FIG. 12 is a timing chart showing another example of the operation of the sweep signal generating device of the present invention.

As described previously, by making the output from the VCO 12 agree with the preset start frequency, the sweep start frequency can be obtained with higher accuracy than in the prior art. Accordingly, the phase synchronization need not always be effected. In the case where no phase synchronization is involved, the sweep by the sweep signal generator 11 is started at the moment $t_1$ as shown in FIG. 12A and, when a signal of coincidence with the start signal is obtained at the moment $t_2$ as shown in FIG. 12B, the sweep is continued and, at the same time, the auxiliary sweep generator 43 is driven to derive therefrom a sweep signal as depicted in FIG. 12C, generating a gate signal as shown in FIG. 12D. Next, when a signal of coincidence with the stop frequency is detected, the sweep is stopped at that moment $t_3$ and the gate signal is then made low-level. In the above, the auxiliary sweep signal generator 43 is provided but it is also possible to omit it and utilize the sweep signal generator 11. In this case, the sweep signal is obtained only in the period from the moment of coincidence with the start frequency to the moment of coincidence with the stop frequency.

Figure 13:
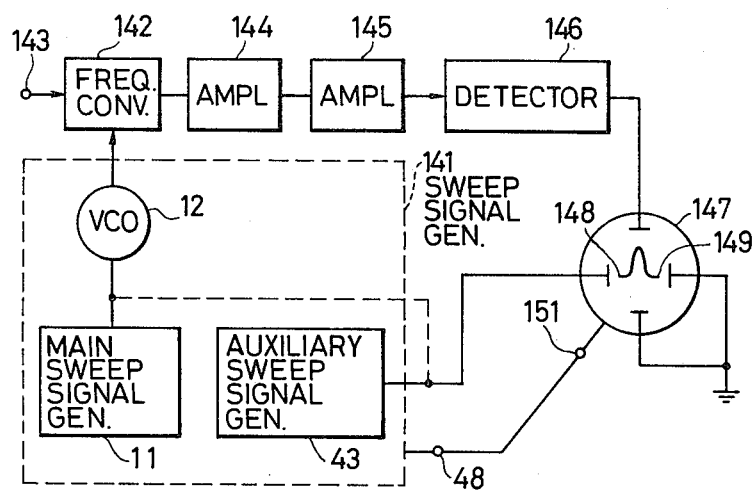
FIG. 13 is a block diagram showing the arrangement of a spectrum analyzer which has incorporated therein the sweep signal generating device of the present invention.

In the case of applying the sweep signal generating device 141 of the present invention, for example, to a spectrum analyzer, as shown in FIG. 13, the output from the VCO 12 is supplied to a frequency converter 142 for frequency conversion of an input signal from an input terminal 143, and the frequency converter output is amplified by an amplifier 144 and further amplified logarithmically by an amplifier 145. The amplified output is detected by a detector 146 and applied to a vertical deflection circuit of a cathode ray tube display 147. On the other hand, the output from the auxiliary sweep signal generator 43 in the sweep signal generating device 141 is supplied to a horizontal deflection circuit of the cathode ray tube display 147, by which one end 148 of a display is produced at a predetermined position on the screen of the cathode ray tube display 147, and the position of the one end 148 of the display corresponds exactly to the start frequency. The other end 149 of the display also appears at a predetermined position corresponding exactly to the stop frequency. If use is made of such an arrangement that the gate control signal from the terminal 48 is applied to an intensity modulation terminal 151 of the cathode ray tube display 147 to provide the display only for the period of the gate control signal, then it is possible to omit the auxiliary sweep signal generator 43 and apply the output from the sweep signal generator 11 to the horizontal deflection circuit of the cathode ray tube display 147, as indicated by the broken line in FIG. 13. Even if the auxiliary sweep signal generator 43 is thus omitted, since the scaling circuit 39 is employed as described above, the control signal for the VCO 12 becomes close to the start frequency and the sweep is immediately started by the scaling circuit 39. Even if the auxiliary sweep signal generator 43 is omitted, the luminance increases on the screen of the cathode ray tube 147 during the sweep stop period, that is, during the phase synchronization period, so that the start point of the display can be known immediately; in addition, the position of the start point coincides exactly with the start frequency and serves as a frequency marker.

Figure 14:
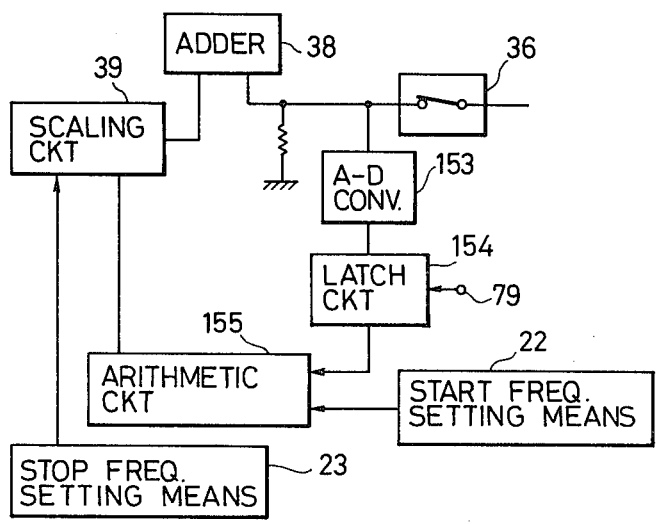
FIG. 14 is a block diagram showing another example of phase synchronization error retaining means.

In the embodiment of FIG. 1, the error signal of the phase lock loop is stored in the capacitor 37, but it is also possible to employ a circuit arrangement for instance as illustrated in FIG. 14. In FIG. 14, the error signal is always converted by an A-D converter 153 into a digital signal, which is latched in a latch circuit 154 by the signal representing the establishment of phase synchronization, the signal being applied from the terminal 79. The latched error signal is operated with the start frequency from the start frequency setting means 22 in an arithmetic circuit 155, and the start frequency corrected by the arithmetic circuit 155 and the stop frequency from the stop frequency setting means 23 are supplied to the scaling circuit 39.

It will be apparent that many modifications and variations may be effected without departing from the scope of the novel concepts of this invention.

What is claimed is:
1. A sweep signal generating device comprising:
a variable frequency oscillator the oscillation frequency of which is controlled by a control signal;
a sweep signal generator for supplying the control signal to the variable frequency oscillator;
sweep start frequency setting means;
sweep stop frequency setting means;
a reference signal generator for generating a reference frequency signal;
start frequency coincidence detecting means for detecting coincidence between the oscillation frequency of the variable frequency oscillator and a start frequency set in the sweep start frequency setting means and for providing a corresponding coincidence detected output;

means for stopping the sweep operation of the sweep signal generator by said coincidence detected output from the start frequency coincidence detecting means;

phase lock loop means for phase-synchronizing the oscillation frequency of the variable frequency oscillator with the reference frequency signal of the reference signal generator by means of said coincidence detected output by adding an error signal to said control signal;

means for detecting the establishment of the phase synchronization of the phase lock loop, for forming and holding said error signal corresponding to an error in the phase synchronization, while supplying the error signal to the variable frequency oscillator, and for cutting off the loop of the phase lock loop means when said phase synchronization is detected;

means for re-starting the sweep operation of the sweep signal generator upon detection of the establishment of the phase synchronization to re-start the sweep operation of the sweep signal generator to sweep the oscillation frequency of the variable frequency oscillator, while continuing to supply the error signal to the variable frequency oscillator;

stop frequency coincidence detecting means for detecting coincidence between the oscillation frequency of the variable frequency oscillator and a sweep stop frequency set in the sweep stop frequency setting means; and means for stopping the sweep operation of the sweep signal generator upon said detection of coincidence by the stop frequency coincidence detecting means.

2. The device of claim 1, wherein the sweep start and stop frequency coincidence detecting means comprise common components including
a counter for periodically counting the output from the variable frequency oscillator, and
a comparator for comparing the count content of the counter with the set sweep start and stop frequencies to provide said coincidence outputs.

3. The device of claim 2, wherein the phase lock loop means comprises
means for causing the counter to continuously perform the counting operation during the time that said phase lock loop is being established,
phase comparing means for phase-comparing the frequency of the coincidence detected output from the comparator with the reference frequency signal to apply a phase-compared output as said error signal to the variable frequency oscillator, and
means for resetting the counter by the coincidence output from the comparator.

4. The device of claim 1, wherein the reference signal generator is a frequency synthesizer
for generating a signal corresponding to the start frequency set in the start frequency setting means at the start of the sweep operation of the sweep signal generator, and
for generating a signal corresponding to the stop frequency set in the stop frequency setting means after the establishment of the phase synchronization, wherein said start and stop frequency coincidence detecting means comprise in common
a frequency mixer for frequency-mixing the output from the variable frequency oscillator with the output from the synthesizer, and
means for detecting that the output frequency of the frequency mixer becomes lower than a predetermined value,
wherein the phase lock loop means comprises means for integrating the output from the frequency mixer and for applying the integrated output as said error signal to the variable frequency oscillator.

5. A sweep signal generating device comprising:
a variable frequency oscillator the oscillation frequency of which is controlled by a control signal;
a sweep signal generator for supplying the control signal to the variable frequency oscillator;
sweep start frequency setting means;
sweep stop frequency setting means;
a reference signal generator for generating a reference frequency signal;
sweep start frequency coincidence detecting means for detecting coincidence between the oscillation frequency of the variable frequency oscillator and a sweep start frequency set in the start frequency setting means;
sweep stop frequency coincidence detecting means for detecting coincidence between the oscillation frequency of the variable frequency oscillator and a sweep stop frequency set in the stop frequency setting means; and
means for taking out the output from the variable frequency oscillator from the moment of detection of its coincidence with the sweep start frequency to the moment of detection of its coincidence with the sweep stop frequency.

6. The device of claim 1 or 5, including scaling means controlled by the strart frequency set in the start frequency setting means and the stop frequency set in the stop frequency setting means to modify the rate of rise and the level of the output from the sweep signal generator and to apply it as a control signal to the variable frequency oscillator.

7. The device of claim 6, wherein the scaling means comprises
first amplitude adjusting means supplied with the output from the sweep signal generator to control its rate of rise by the stop frequency,
invert and shift means for generating a signal inverted in polarity with respect to the output from the sweep signal generator and shifted in level by the maximum amplitude of the output of the sweep signal generator so that its lowest and highest levels are equal to those of the output from the sweep signal generator,
second amplitude adjusting means for controlling the rate of rise of the polarity-inverted and level-shifted signal by the start frequency, and
adding means for adding together the outputs of the first and second amplitude adjusting means.

8. The device of claim 7, wherein the first and second amplitude adjusting means are each controlled by a digital signal.

9. The device of claim 6, wherein the scaling means comprises
amplitude adjusting means for adjusting the rate of rise of the output from the sweep signal generator in accordance with a frequency corresponding to the difference between the start and the stop frequencies, level adjusting means for generating a signal of a DC level corresponding to the start frequency, and adding means for adding together the outputs from the rate of rise adjusting means and the level adjusting means.

10. The device of claim 9, including means for obtaining the rate of rise adjusted output and an output opposite thereto in polarity, and change-over means for selectively applying the rate of rise adjusted output and the opposite-polarity output to the adding means in accordance with the relative magnitudes of the start and the stop frequencies.

11. The device of claim 1, including means for taking out the output from the variable frequency oscillator for a predetermined period of time from the establishment of the phase synchronization to the detection of the coincidence with the sweep stop frequency, said predetermined period of time being independent of the sweep start and stop frequencies.

12. The device of claim 5 or 11, including an auxiliary sweep signal generator for generating another sweep signal for the same period of time as that for taking out the output from the variable frequency oscillator.

13. The device of claim 1, comprising scaling means controlled by the sweep start frequency and the sweep stop frequency to adjust the rate of rise and level of the output from the sweep signal generator and to apply the rate of rise-adjusted output as a control signal to the variable frequency oscillator, wherein the means for holding the error signal of the phase lock loop means comprises means for converting the error signal to a digital signal and means for adding the digital signal to the starting frequency and applying the added output to the scaling means.

14. A sweep signal generating device comprising:

a variable frequency oscillating means the output oscillation frequency of which is controlled by a control signal applied thereto;

a sweep signal generating means connected to the variable frequency oscillating means for supplying thereto the control signal;

sweep start frequency setting means;

sweep stop frequency setting means;

a reference signal generating means for generating a reference frequency signal;

coincidence detecting means for detecting coincidence of the oscillation frequency of the variable frequency oscillating means with a sweep start frequency set in the sweep start frequency setting means and a sweep stop frequency set in the sweep stop frequency setting means;

means for stopping the sweep operation of the sweep signal generating means;

phase lock loop means, including the variable frequency oscillating means in its loop and connected to the reference signal generating means, for phase-synchronizing the oscillation frequency of the variable frequency oscillating means with the reference frequency signal of the reference signal generating means; and control means for stopping the sweep operation of the sweep signal generating means by the sweep start frequency coincidence detected by the coincidence detecting means, for activating the phase lock loop means to detect establishment of the phase synchronization, for opening the loop of the phase lock loop when the phase synchronization is established, for re-starting the sweep operation of the sweep signal generating means, and for stopping the sweep operation of the sweep signal generating means by the output from the coincidence detecting means upon the detecting of coincidence between the oscillation frequency of the variable frequency oscillating means controlling by the re-started sweep operation and the sweep stop frequency set in the sweep stop frequency setting means.

15. A sweep signal generator for providing a frequency swept output between selectable sweep start and stop frequencies, said generator comprising a voltage controlled oscillator (VCO) responsive to a control voltage applied thereto for providing said frequency-swept output, a VCO sweep means for supplying a nominal output voltage at a level corresponding approximately to the selected sweep start frequency, and for subsequently sweeping said output voltage of the VCO sweep means between said level corresponding approximately to the selected sweep start frequency and the level corresponding approximately to the selected sweep stop frequency, a reference generator for generating a reference frequency, and phase lock means for phase locking the VCO output to the reference frequency, while said VCO sweep means supplies said nominal output voltage corresponding approximately to the selected sweep start frequency, to adjust the VCO output to be equal to the selected sweep start frequency by the generation of an error signal that is combined with said nominal output voltage, and for detecting the phase synchronization between said reference frequency and a frequency corresponding to said adjusted VCO output to cause to begin said sweeping by said VCO sweep means, while continuing to supply during said sweeping said error signal for said combining with the output of said VCO sweep means as said control voltage of said VCO, wherein said VCO output is operated on to allow said phase synchronization with the reference frequency for any selected sweep start frequency.

16. The generator of claim 15, said VCO sweep means comprising a scaling circuit to control said sweeping of said output voltage of the VCO sweep means between said levels corresponding approximately to the selected sweep start and stop frequencies in a predetermined sweep period that is independent of said selected sweep start and stop frequencies.

17. The generator of claim 15, said phase lock means comprising a feedback loop including a counter for continuously and repeatedly counting in correspondence to the cycles of said VCO output, a count comparator for comparing the count of said counter with said selected sweep start frequency and for outputting a coincidence signal when coincidence therebetween is detected, said coincidence signal serving to restart the counting of said counter, a phase comparator for comparing the phase of said coincidence signal with the phase of said reference frequency, and for generating as an output said error signal in correspondence to the phase difference therebetween.

18. The generator of claim 17, said VCO sweep means comprising a scaling circuit to control said sweeping of said output voltage of the VCO sweep means between said levels corresponding approximately to the selected sweep start and stop frequencies in a predetermined sweep period that is independent of said selected sweep start and stop frequencies.

19. The generator of claim 16 or 18,
said VCO sweep means comprising a sweep signal generator for supplying a ramp voltage to said scaling circuit, and
said scaling circuit comprising
a first amplitude adjuster that is controlled by the selected sweep stop frequency to modify the rate of rise of said ramp voltage and to supply a corresponding output,
an invert and level shift circuit to invert and change the level of said ramp voltage and to supply a corresponding output,
a second amplitude adjuster that is controlled by the selected sweep start frequency to modify the rate of rise of the output of said invert and level shift circuit, and
an adder for adding said outputs of the first and second amplitude adjusters.

20. The generator of claim 16 or 18,
said VCO sweep means comprising a sweep signal generator for supplying a ramp voltage to said scaling circuit, and
said scaling circuit comprising
an arithmetic circuit for receiving in digital form the selected start and stop frequencies, and for computing a level adjustment signal dependent upon the selected sweep start frequency and rate of rise adjustment signal that is dependent on the difference of the selected sweep start and stop frequencies,
a level adjuster controlled by said level adjustment signal,
an amplitude adjuster that receives said ramp voltage and modifies its rate of rise in accordance with said amplitude adjustment signal, and
an adder for adding the outputs of said level and amplitude adjusters for supplying the sum as said output of said VCO sweep means.

21. The generator of claim 20,
said arithmetic circuit generating said amplitude adjustment signal independently of the sign of the difference of the selected sweep start and stop frequencies, and further generating a polarity signal corresponding to the sign of this frequency difference, and
said scaling circuit comprising an inverter and a switch connected to receive the output of said amplitude adjuster and to selectively supply the inverted or non-inverted output thereof to said adder depending on the sign of said polarity signal.

22. The generator of claim 17 or 18, said feedback loop including
said VCO having as input said control signal,
said counter having as input a signal corresponding to the VCO output,
said count comparator having as inputs the output of said counter and the selected start frequency, and
an adder for adding said output of the VCO sweep means with said error signal for supplying the sum as said control signal for the VCO.

23. The generator of claim 22, comprising
a capacitor connected to said error signal output of the phase comparator for receiving said error signal during said phase synchronization and for supplying said error signal during said subsequent sweeping of said VCO sweep means, and
said feedback loop including a switch connected between said capacitor and said error signal output of the phase comparator, said switch being closed during said phase synchronization and subsequently opened for said sweeping of said VCO sweep means.

24. The generator of claim 16, said phase lock means including
a frequency synthesizer for supplying in analog form the selected sweep start frequency,
a frequency mixer connected to mix said output of the VCO with the selected sweep start frequency in analog form and to output the correspondingly mixed signal,
a low pass filter connected to receive said mixed signal, the output of which is supplied as said error signal during said phase synchronization, and
an adder for adding said error signal and said output of the VCO sweep means to supply said control voltage for said VCO,
wherein said phase synchronization, and said sweeping between the selected sweep start and stop frequencies are controlled on an analog basis.

25. The generator of claim 24,
said VCO sweep means comprising a sweep signal generator for supplying a ramp voltage to said scaling circuit, and
said scaling circuit comprising
a first amplitude adjuster that is controlled by the selected sweep stop frequency to modify the rate of rise of said ramp voltage and to supply a corresponding output,
an invert and level shift circuit to invert and change the level of said ramp voltage and to supply a corresponding output,
a second amplitude adjuster that is controlled by the selected sweep start frequency to modify the rate of rise of the output of said invert and level shift circuit, and
an adder for adding said outputs of the first and second amplitude adjusters.

26. The generator of claim 24,
said VCO sweep means comprising a sweep signal generator for supplying a ramp voltage to said scaling circuit, and
said scaling circuit comprising
an arithmetic circuit for receiving in digital form the selected sweep start and stop frequencies, and for computing a level adjustment signal dependent upon the selected sweep start frequency and rate of rise adjustment signal that is dependent on the difference of the selected sweep start and stop frequencies,
a level adjuster controlled by said level adjustment signal,
an amplitude adjuster that receives said ramp voltage and modifies its rate of rise in accordance with said amplitude adjustment signal, and an adder for adding the outputs of said level and amplitude adjusters for supplying the sum as said output of said VCO sweep means.

27. The generator of claim 24, comprising a capacitor and a switch connected to the output of said low pass filter for receiving said error signal during said phase synchronization and for providing same during said subsequent sweeping by said VCO sweep means between said sweep start and stop frequencies.

* * * * *

UNITED STATES PATENT AND TRADEMARK OFFICE
CERTIFICATE OF CORRECTION

PATENT NO. : 4,349,789
DATED : 14 September 1982
INVENTOR(S) : TAKENORI KURIHARA It is certified that error appears in the above-identified patent and that said Letters Patent is hereby corrected as shown below:

Drawings, sheet 1 of 10, Fig. 1, the terminal at the bottom of frequency divider 17 should be labelled --E--;

sheet 2 of 10, Fig. 2, "START" in box $S_7$ should read --STOP--;

sheet 3 of 10, Fig. 7, the reference character "26" of the box at the bottom of the figure should be --22--, and the box should be labelled --START FREQUENCY SETTING MEANS--;

sheet 4 of 10, Fig. 4, "COMPARATER" in box 19 should read --COMPARATOR--.

Col. 2, line 29, "in start" should be --in a start--.
Col. 3, line 27, "signal from" should be --signals from--.
Col. 4, line 37, after "as" insert --a--;
line 66, after "multi-" insert --digit--.
Col. 9, line 16, "Q" should be --$\bar{Q}$--;
line 29, "increases" should be --increase--;
line 37, "Q" should be --$\bar{Q}$--;
line 47, "I" should be --$\bar{I}$--.
Col. 10, line 54, "t" should be --to--;
line 54, "Q" should be --$\bar{Q}$--.

UNITED STATES PATENT AND TRADEMARK OFFICE
CERTIFICATE OF CORRECTION

PATENT NO. : 4,349,789

DATED : 14 September 1982

INVENTOR(S) : TAKENORI KURIHARA

It is certified that error appears in the above-identified patent and that said Letters Patent is hereby corrected as shown below:

Col. 12, line 1, after "MHz" insert --and--;
line 2, delete "and".
Col. 17, line 32, after "adjusted" insert --and level-adjusted--.
Col. 18, line 12, "controlling" should be --controlled--.

Signed and Sealed this

Eighth Day of March 1983

[SEAL]

Attest:

GERALD J. MOSSINGHOFF

Attesting Officer

Commissioner of Patents and Trademarks